(12) United States Patent
Mattes et al.

(10) Patent No.: US 7,704,126 B2
(45) Date of Patent: Apr. 27, 2010

(54) METHOD FOR PRODUCING A SEMICONDUCTOR WAFER WITH PROFILED EDGE

(75) Inventors: Joachim Mattes, Burghausen (DE); Anton Huber, Burghausen (DE); Joerg Moser, Unterneukirchen (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 11/744,230

(22) Filed: May 4, 2007

(65) Prior Publication Data
US 2007/0264911 A1 Nov. 15, 2007

(30) Foreign Application Priority Data
May 11, 2006 (DE) .............. 10 2006 022 089

(51) Int. Cl.
*B24B 9/06* (2006.01)
(52) U.S. Cl. .......................... 451/44; 451/57
(58) Field of Classification Search .............. 451/43, 451/44, 57, 58, 63, 41
See application file for complete search history.

(56) References Cited

U.S. PATENT DOCUMENTS

| | | | |
|---|---|---|---|
| 4,793,101 A | 12/1988 | Dlouhy et al. | |
| 5,494,862 A * | 2/1996 | Kato et al. | 438/693 |
| 5,882,539 A * | 3/1999 | Hasegawa et al. | 216/88 |
| 6,066,565 A | 5/2000 | Kuroki et al. | |
| 6,114,245 A * | 9/2000 | Vandamme et al. | 438/690 |
| 6,465,328 B1 * | 10/2002 | Hashii et al. | 438/459 |
| 6,699,774 B2 | 3/2004 | Takyu et al. | |
| 7,258,931 B2 * | 8/2007 | Kim et al. | 428/641 |
| 2004/0157461 A1 | 8/2004 | Kononchuk et al. | |
| 2005/0173377 A1 | 8/2005 | Pitsch et al. | |
| 2006/0194520 A1 | 8/2006 | Nakayama et al. | |

FOREIGN PATENT DOCUMENTS

| | | |
|---|---|---|
| CN | 1534734 A | 10/2004 |
| DE | 19954349 A1 | 6/2001 |
| DE | 102004005702 A1 | 9/2005 |
| JP | 6232428 A | 8/1994 |

* cited by examiner

*Primary Examiner*—Robert Rose
(74) *Attorney, Agent, or Firm*—Brooks Kushman P.C.

(57) ABSTRACT

Semiconductor wafers with profiled edges, are produced with decreased losses due to edge or other damage by separating a semiconductor wafer from a crystal; profiling the edge in a profile producing step wherein the edge is mechanically machined to a profile that is true to scale with respect to a predefined target profile; mechanically machining the wafer to reduce the a thickness of the semiconductor wafer; and machining the edge profile to acquire the target profile.

8 Claims, 2 Drawing Sheets

METHOD FOR PRODUCING A SEMICONDUCTOR WAFER WITH PROFILED EDGE

BACKGROUND OF THE INVENTION

1. Field of the Invention

The invention relates to a method for producing a semiconductor wafer with a profiled edge, in which the semiconductor wafer is separated from a crystal and subjected to further machining steps.

2. Background Art

The invention relates, in particular, to a method for producing a semiconductor wafer which serves as a substrate wafer for electronic circuits, for example a semiconductor wafer composed of silicon or a compound semiconductor or else a semiconductor wafer which is constructed in layered fashion and comprises at least one layer composed of semiconductor material. The production of such semiconductor wafers constitutes a particular challenge since they have to meet extremely stringent requirements not only with regard to the purity of the material used but also with regard to form and flatness.

Customary machining steps devoted to shaping the semiconductor wafer after separation from a crystal aim to give the semiconductor wafer a form which is distinguished, in particular, by a profiled edge and sides that are opposite one another in plane-parallel fashion. A machining step that produces an edge profile is necessary because the edge is particularly susceptible to breaking in the non-machined state and a semiconductor wafer can be damaged even by slight pressure and/or temperature loadings in the edge region. The shaping machining steps include, besides an edge profile producing step, in particular lapping and grinding of the sides. The two mechanical machining steps mentioned last can be employed together, lapping followed by grinding, or in such a way that only one of the two machining steps is performed. The grinding of the side can be subdivided into rough and fine grinding steps depending on the grit of the abrasive grain used. Furthermore, the grinding may be restricted to one side of the semiconductor wafer or encompass both sides of the semiconductor wafer. If both sides are to be ground, then this can be carried out successively or in one step. DE 10 2004 005 702 A1 describes a double-side grinding machine having double spindles and a method carried out with this machine in which both sides of a semiconductor wafer are ground simultaneously. The semiconductor wafer is guided in a free-floating and rotating fashion between two mutually opposite grinding discs and is held in position by a guide ring (rotor ring) surrounding it. The rotary movement of the semiconductor wafer is brought about for example by a notch finger, which engages in an orientation notch on the circumference of the semiconductor wafer, or by a friction belt which partly encloses the semiconductor wafer on the circumference. A prerequisite for the undisturbed rotary movement is that the semiconductor wafer is round, that is to say has a circular circumference.

Semiconductor wafers in which the orientation of the crystal lattice deviates slightly from the orientation of the crystal from which they were separated have advantageous properties which become apparent particularly in thermal treatments and methods in which layers are deposited on the semiconductor wafer. In accordance with DE 199 54 349 A1, semiconductor wafers with misorientation are obtained if the semiconductor wafers are not separated perpendicular to the crystal axis, but rather at an angle that deviates therefrom and corresponds to that of the intended misorientation. Elliptically shaped semiconductor wafers are obtained from a crystal having a uniform diameter ground in round fashion. Owing to this shape, such a semiconductor wafer initially cannot be subjected to a mechanical machining of the sides by simultaneous grinding of the sides. A comparatively complicated possibility for avoiding this problem consists, for example, in separating the misoriented semiconductor wafers from a crystal having an elliptical cross-sectional area which is dimensioned in such a way that round semiconductor wafers arise during separation.

The machining step that produces an edge profile may be effected before or after the mechanical machining of the sides of the semiconductor wafer. What is disadvantageous with regard to a machining step that does not produce the edge profile until after the sides of the semiconductor wafer have been mechanically machined is that the edge is so sensitive in the unmachined state that the semiconductor wafer often does not withstand the mechanical machining of the sides without being damaged in the process. A semiconductor wafer with a profiled edge still remains sensitive, however, even though serious damage such as edge chips and cracks is less common. Therefore, it is likewise disadvantageous if the edge profile is produced before the mechanical machining takes place, because later damage to the edge can no longer be completely repaired.

U.S. Pat. No. 6,066,565 describes a method in which the edge profile is produced in two separate mechanical machining steps, between which the mechanical machining of the sides of the semiconductor wafer is provided. In the first of the two steps, the edge is chamfered at the sides, part of the edge remaining unmachined. The aim of this method is to stabilize the edge by means of the first rough machining such that serious damage is avoided in the subsequent side grinding step, which aims to retain the symmetry of the semiconductor wafer with regard to a horizontal reflection plane. What is disadvantageous about this method is that the edge of the semiconductor wafer has, during the mechanical machining of the sides, a region that has not yet been machined and is therefore particularly sensitive, and, as a result, is not protected much better than if the edge machining had not taken place at all.

SUMMARY OF THE INVENTION

An object of the present invention was to provide a method which enables the shaping machining of a semiconductor wafer separated from a crystal with great precision and a high yield because the disadvantages described above are not associated therewith. These and other objects are achieved by means of a method for producing a semiconductor wafer with a profiled edge, comprising the following steps: separation of a semiconductor wafer from a crystal; an edge profile producing step, in which the edge is mechanically machined and acquires a profile that is true to scale with respect to a target profile; a mechanical machining step, in which a thickness of the semiconductor wafer is reduced; and an edge profile machining step, in which the edge is mechanically machined and acquires the target profile.

DETAILED DESCRIPTION OF THE PREFERRED EMBODIMENT(S)

In the edge profile producing step, the edge acquires a profile which is true to scale, that is to say geometrically similar, with respect to a target profile. The target profile is that profile which the edge is intended to have after the edge profile machining step. The profile produced in the edge profile producing step protects the edge against damage to the same extent as an edge which already has the target profile. Since this protection is only limited, however, and damage still occurs during subsequent mechanical machining of the sides of the semiconductor wafer, a further edge machining step is provided after the mechanical machining of the sides of the semiconductor wafer in order to eliminate such damage. During this further machining step, material is mechanically removed uniformly from the edge, whereby the profile already produced is not altered in terms of its form, but rather is only reduced to the target profile. The uniform material removal has the effect, however, of completely removing damage to the edge which occurred as a result of the preceding mechanical machining of the sides of the semiconductor wafer.

The inventive method divides the mechanical machining of the edge into two steps that are interrupted by the mechanical machining of the sides. In contrast to the procedure described in the patent U.S. Pat. No. 6,066,565, however, this method has a series of advantages. Thus, the edge does not remain partly unmachined prior to the mechanical machining of the sides and is less sensitive than an edge which is only chamfered. Accordingly, not only is it less common for a semiconductor wafer to be damaged during the mechanical machining of the sides, for example as a result of chips, cracks, scratches and the like, but it is also less common for such damage to give rise to damage or to foster wear of parts of the machining apparatus, in particular the guide ring and the notch finger of a double-side grinding machine. Furthermore, a semiconductor wafer having an elliptical form whose edge was only chamfered in the first step of the mechanical machining of the edge would maintain its elliptical form and would not be able to be ground by means of a double-side grinding machine. In the case of the method according to the present invention, a semiconductor wafer having an elliptical form is simultaneously ground in round fashion in the course of the first machining step, which produces the edge profile.

The invention is explained in more detail below on the basis of a particularly preferred embodiment with reference to figures. The figures show schematic edge profiles and the change thereof in the course of the method.

Figure 1:
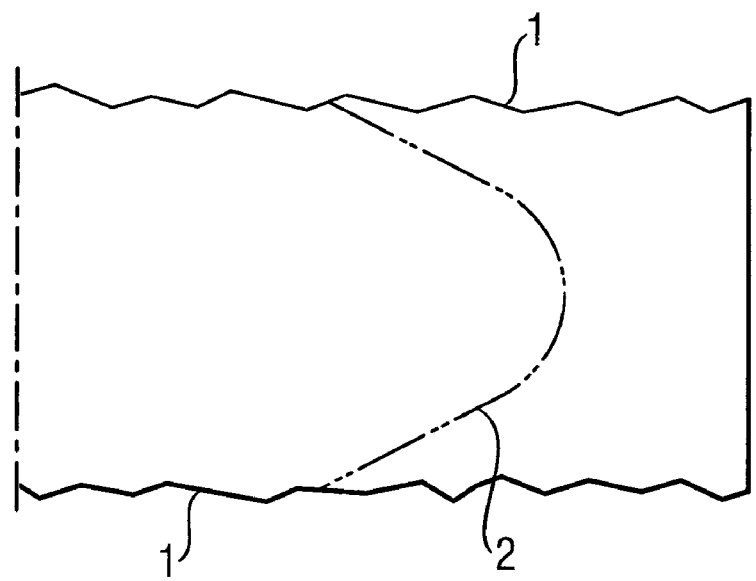
FIG. 1 illustrates a wafer edge profile to be achieved in an edge profile producing step.
Figure 2:
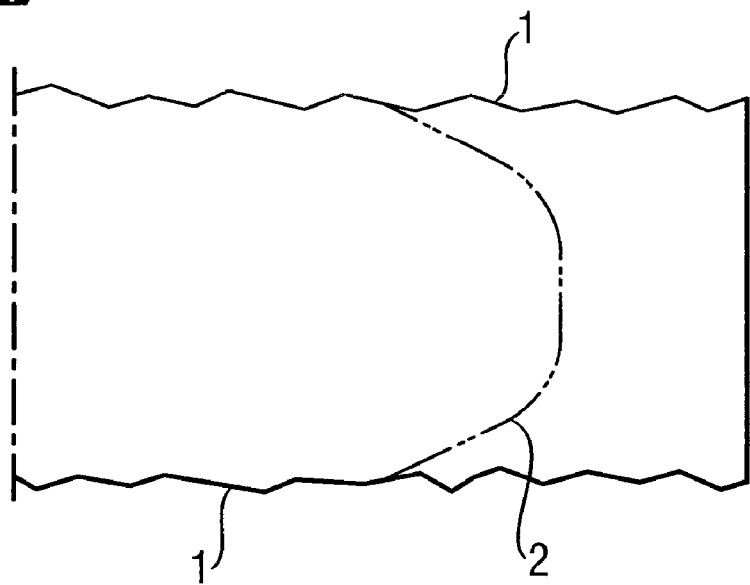
FIG. 2 illustrates a further wafer edge profile to be achieved in an edge profile producing step.
Figure 3:
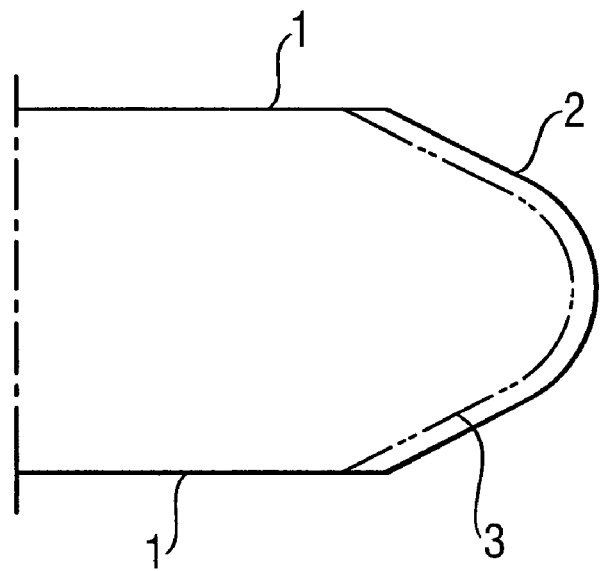
FIG. 3 illustrates additional material removal from the wafer of FIG. 1 while maintaining the geometry of the edge, in an edge machining step.
Figure 4:
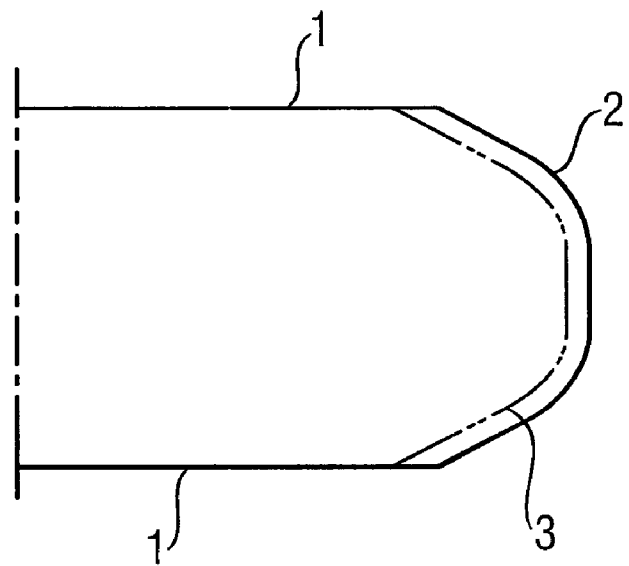
FIG. 4 illustrates additional material removal from the wafer of FIG. 2 while maintaining the geometry of the edge, in an edge machining step.

At the start of the method, there is a semiconductor wafer which was separated from a crystal, for example a wafer made of silicon, obtained together with a multiplicity of wafers of identical type by dividing the crystal with the aid of a wire saw. A cross section of such a semiconductor wafer is approximately rectangular. FIGS. 1 and 2 illustrate the contours of the sides 1 as a series of intercepting line segments in order to indicate the roughness of the sides after the separation of the semiconductor wafer. In the subsequent edge profile producing step, the edge is machined mechanically and thereby acquires a profile 2 that is true to scale with respect to a target profile 3 (FIGS. 3, 4). The edge profile producing step is performed using a grinding tool with fixed abrasive grain, for example a grinding disc, preferably with rough grit. The form of the target profile is predefined by the customer for the semiconductor wafer. This may involve for example an R-profile (radius profile) in accordance with FIGS. 1 and 3 or a T-profile (trapezoid profile) in accordance with FIGS. 2 and 4. The edge profile producing step can be subdivided into two or more partial steps, one partial step preferably using an abrasive grain with finer grit than in the preceding partial step.

The subsequent mechanical machining step, in which material is removed from the sides of the semiconductor wafer by lapping and/or grinding, serves for thinning the semiconductor wafer and obtaining lateral surfaces that are as flat and parallel as possible. The result of this machining step is a semiconductor wafer in accordance with FIG. 3 or FIG. 4, depending on the form of the profile. In the subsequent edge profile machining step, the edge is mechanically machined for a second time. The material removal effected in this case gives rise to the target profile 3. The profile 2 and the target profile 3 are geometrically similar, or in other words the profile 2 is true to scale with respect to the target profile 3. The edge profile machining step is performed using a grinding tool with fixed abrasive grain, for example a grinding disc, an abrasive pad or an abrasive tape, preferably with fine grit. An average size of the abrasive grain is preferably 15 µm to 0.5 µm, particularly preferably 5 µm to 0.5 µm. The edge profile machining step can be subdivided into two or more partial steps, one partial step preferably using an abrasive grain with finer grit than in the preceding partial step.

When a particularly fine-grained abrasive grain is used in the edge profile machining step, the edge can be smoothed to an extent such that a later chemical mechanical polishing of the edge can be dispensed with. It is therefore likewise preferred for the method according to the invention not to comprise a chemical mechanical edge polishing, that is to say a polishing using a polishing pad in the presence of a slurry containing an etching active substance and an abrasively acting solid.

A semiconductor wafer obtained in this way is then preferably etched or finely ground and polished on both sides, or etched and finely ground and polished on both sides, in order to eliminate damage to the crystal lattice near the surface and in order to increase the local flatness of the lateral surfaces.

EXAMPLE 1

In a comparative test, 600 semiconductor wafers made of silicon having a diameter of 300 mm were mechanically machined in a manner according to the invention (edge profile producing step with grinding disc having rough grit, simultaneous grinding on both sides and edge profile machining step with grinding disc having fine grit) without loss of any wafers having been produced after the edge profile machining step, owing to damage to the edge. By contrast, if the edge machining was dispensed with prior to double sided grinding and the edge was provided with the target profile only afterward, some of the semiconductor wafers processed in this way failed owing to damage to the edge.

EXAMPLE 2

2000 semiconductor wafers made of silicon with a misoriented crystal lattice and an ovality of 0.3 to 0.7 mm were mechanically machined in a manner according to the invention (edge profile producing step with grinding disc having rough grit, simultaneous grinding on both sides and edge profile machining step with grinding disc having fine grit) without loss of any wafers having been produced after the edge profile machining step, owing to damage to the edge.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a semiconductor wafer with front and back sides and a profiled edge, comprising the following steps, in the order given:
    selecting a target profile for the profiled edge;
    separating a semiconductor wafer from a crystal;
    producing an edge profile in an edge profile producing step by a first grinding of the edge to acquire a profile that is true to scale with respect to the target profile, wherein the first grinding is performed with a grinding tool with rough grit;
    machining at least one side of the wafer in a mechanical machining step, in which a thickness of the semiconductor wafer is reduced; and
    further machining the edge in an edge profile machining step by a second grinding of the edge to acquire the target profile, wherein the second grinding is performed with a grinding tool with fine grit and the edge is smoothed thereby; and
    etching and polishing the semiconductor wafer, wherein a chemical mechanical polishing of the edge is dispensed with after the edge profile machining step.

2. The method of claim 1, wherein in the edge profile producing step, an elliptical form of the semiconductor wafer is converted into a round form.

3. The method of claim 1, wherein the mechanical machining step in which the thickness of the semiconductor wafer is reduced, and the edge profile producing step are carried out simultaneously.

4. The method of claim 1, wherein the grit of the grinding tool with rough grit corresponds to an average grain size of 15 µm to 0.5 µm.

5. The method of claim 1, wherein the edge profile producing step comprises two or more partial edge profile producing steps.

6. The method of claim 1, wherein the edge profile machining step comprises two or more partial edge profile machining steps.

7. The method of claim 1, wherein the step of machining at least one side of the wafer comprises double-side grinding which machines both the front and rear surfaces of the wafer.

8. The method of claim 1, wherein the wafer is etched and subjected to double-sided fine grinding, and then the wafer front and rear surfaces are polished.

* * * * *